United States Patent
Chern et al.

(10) Patent No.: US 11,776,992 B2
(45) Date of Patent: Oct. 3, 2023

(54) TRENCH CAPACITOR HAVING IMPROVED CAPACITANCE AND FABRICATION METHOD THEREOF

(71) Applicant: HeFeChip Corporation Limited, Sai Ying Pun (HK)

(72) Inventors: Geeng-Chuan Chern, Cupertino, CA (US); Liang-Choo Hsia, Hsinchu (TW)

(73) Assignee: HeFeChip Corporation Limited, Sai Ying Pun (HK)

( * ) Notice: Subject to any disclaimer, the term of this patent is extended or adjusted under 35 U.S.C. 154(b) by 0 days.

(21) Appl. No.: 17/489,796

(22) Filed: Sep. 30, 2021

(65) Prior Publication Data

US 2022/0020844 A1 Jan. 20, 2022

Related U.S. Application Data

(63) Continuation of application No. 16/590,334, filed on Oct. 1, 2019, now Pat. No. 11,139,368.

(51) Int. Cl.
*H10B 12/00* (2023.01)
*H01L 49/02* (2006.01)

(52) U.S. Cl.
CPC ......... *H01L 28/87* (2013.01); *H10B 12/0387* (2023.02); *H10B 12/312* (2023.02)

(58) Field of Classification Search
None
See application file for complete search history.

(56) References Cited

U.S. PATENT DOCUMENTS

| | | | |
|---|---|---|---|
| 5,290,726 A | 3/1994 | Kim | |
| 5,903,024 A | 5/1999 | Hsu | |
| 6,008,515 A | 12/1999 | Hsia | |
| 7,276,751 B2 | 10/2007 | Ho | |
| 7,682,896 B2 | 3/2010 | Ho | |
| 2003/0042519 A1 | 3/2003 | Tzeng | |
| 2007/0001203 A1 | 1/2007 | Lehr | |
| 2007/0057302 A1 | 3/2007 | Ho | |
| 2008/0111154 A1* | 5/2008 | Voldman | H01L 21/8249 257/E27.098 |
| 2009/0236691 A1 | 9/2009 | Dyer | |
| 2011/0169065 A1 | 7/2011 | Cheng | |
| 2012/0049262 A1* | 3/2012 | Huang | H01L 29/945 257/E21.654 |
| 2015/0079803 A1 | 3/2015 | Huang | |
| 2017/0213884 A1* | 7/2017 | Balakrishnan | H01L 29/0847 |
| 2021/0013302 A1* | 1/2021 | Lu | H01G 4/01 |

* cited by examiner

*Primary Examiner* — Vincent Wall
(74) *Attorney, Agent, or Firm* — Winston Hsu

(57) ABSTRACT

A semiconductor memory device includes a substrate; a film stack on the substrate; a silicon device layer on the film stack; and a trench with corrugated sidewall surface extending into the silicon device layer, the film stack, and the substrate. A trench capacitor is located in the trench. The trench capacitor includes an inner electrode and an outer electrode with a node dielectric layer therebetween. The node dielectric layer is in direct with the film stack and the bulk semiconductor substrate. A transistor is disposed on the substrate. The transistor includes a source region and a drain region, a channel region between the source region and the drain region, and a gate over the channel region. The source region is electrically connected to the inner electrode of the trench capacitor.

10 Claims, 11 Drawing Sheets

TRENCH CAPACITOR HAVING IMPROVED CAPACITANCE AND FABRICATION METHOD THEREOF

CROSS REFERENCE TO RELATED APPLICATIONS

This is a continuation application of U.S. application Ser. No. 16/590,334 filed on Oct. 1, 2019, the disclosure of which is included in its entirety herein by reference.

BACKGROUND OF THE INVENTION

1. Field of the Invention

The present disclosure relates generally to the field of semiconductor technology. More particularly, the present disclosure relates to a semiconductor memory device comprising a trench capacitor with increased capacitance, and a method for fabricating the same.

2. Description of the Prior Art

It is a general trend for modern memory device technologies to reduce the dimension from generation to generation. It is desirable for dynamic random access memories (DRAMs), which include a capacitor for each memory cell, to improve the capacitance per unit area for compensating area loss due to dimension reduction. In the prior arts, the goal have been achieved for DRAM cell with a stack capacitor by implementing rugged poly silicon bottom electrode or corrugated side wall configuration to maximize the surface area.

DRAM cells with a trench capacitor are suited for embedded applications. However, current approach to the improvement on the capacitance per unit area for the trench capacitor is to increase the trench depth. As the geometry becomes smaller, increasing the trench depth has great difficulties for trench formation, as well as capacitor dielectric and inner electrode formation, due to high aspect ratio.

Therefore, there is a need in this technical field to provide an improved semiconductor memory device having a trench capacitor with increased sidewall surface area without increasing the trench depth for DRAMs.

SUMMARY OF THE INVENTION

It is one objective of the present disclosure to provide a semiconductor memory structure comprising a trench capacitor with increased sidewall surface area without increasing the trench depth for DRAMs.

One aspect of the present disclosure provides a semiconductor memory device including a semiconductor-on-insulator (SOI) substrate having a semiconductor substrate, a film stack comprising alternating layers comprising alternating silicon germanium (SiGe) epitaxial layers and silicon (Si) epitaxial layers on the semiconductor substrate, a buried oxide layer on the film stack, and a silicon device layer on the buried oxide layer. At least one trench penetrates through the silicon device layer, the buried oxide layer, and the film stack. The at least one trench comprises corrugated sidewall surface located under the buried oxide layer.

At least one trench capacitor is disposed in the at least one trench. The at least one trench capacitor includes an inner electrode and an outer electrode with a node dielectric layer therebetween. The outer electrode of the at least one trench capacitor includes a semiconductor layer disposed around a lower sidewall and a bottom of the at least one trench.

A conductive layer is disposed in the trench atop the inner electrode and the node dielectric layer. A top surface of the conductive layer is not lower than a top surface of the silicon device layer. At least one transistor is disposed on the substrate. The at least one transistor comprises a source region and a drain region, a channel region between the source region and the drain region, and a gate over the channel region.

A first silicide layer is disposed in the trench and on a sidewall of the silicon device layer. The first silicide layer is located between the source region and the conductive layer. The source region is electrically connected to the inner electrode of the at least one trench capacitor through the first silicide layer and the conductive layer. A second silicide layer caps the conductive layer and is in direct contact with the first silicide layer.

According to some embodiments, each of the SiGe epitaxial layers has a thickness of about 2-20 nm and each of the Si epitaxial layers has a thickness of about 2-20 nm.

According to some embodiments, the at least one trench comprises recesses in the SiGe epitaxial layers, respectively.

According to some embodiments, the inner electrode layer comprises fin-like electrodes laterally extending into the recesses, respectively.

According to some embodiments, the at least one trench has a depth ranging between 200 and 1000 nm.

According to some embodiments, the outer electrode comprises a self-aligned silicide layer disposed between the node dielectric layer and the semiconductor layer.

According to some embodiments, the self-aligned silicide layer comprises tungsten silicide, cobalt silicide, nickel silicide, or titanium silicide.

According to some embodiments, the drain region of the transistor is connected to a bitline.

Another aspect of the present invention provides a semiconductor memory device including a bulk semiconductor substrate; a film stack on the bulk semiconductor substrate; a silicon device layer on the film stack; and at least one trench with corrugated sidewall surface extending into the silicon device layer, the film stack, and the bulk semiconductor substrate.

At least one trench capacitor is located in the at least one trench. The at least one trench capacitor includes an inner electrode and an outer electrode with a node dielectric layer therebetween. The node dielectric layer is in direct with the film stack and the bulk semiconductor substrate.

At least one transistor is disposed on the substrate. The at least one transistor comprises a source region and a drain region, a channel region between the source region and the drain region, and a gate over the channel region. The source region is electrically connected to the inner electrode of the at least one trench capacitor.

According to some embodiments, the film stack comprises alternating layers.

According to some embodiments, the alternating layers comprise alternating silicon germanium (SiGe) epitaxial layers and silicon (Si) epitaxial layers.

According to some embodiments, each of the SiGe epitaxial layers has a thickness of about 2-20 nm and each of the Si epitaxial layers has a thickness of about 2-20 nm.

According to some embodiments, the at least one trench comprises recesses in the SiGe epitaxial layers, respectively.

According to some embodiments, the inner electrode layer comprises fin-like electrodes laterally extending into the recesses, respectively.

According to some embodiments, the at least one trench has a depth ranging between 200 and 1000 nm.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
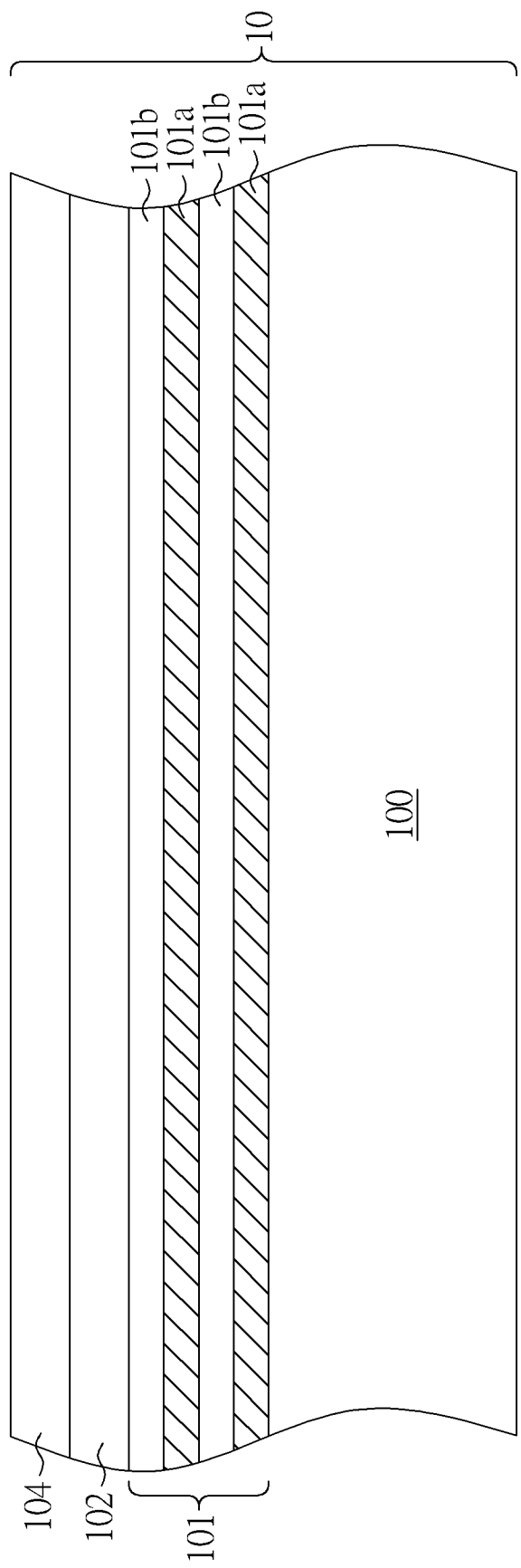
FIG. 1 to FIG. 10 are cross-sectional diagrams showing a method for fabricating a semiconductor device with a trench capacitor according to one embodiment of the present disclosure.

It should be noted that all the figures are diagrammatic. Relative dimensions and proportions of parts of the drawings are exaggerated or reduced in size, for the sake of clarity and convenience. The same reference signs are generally used to refer to corresponding or similar features in modified and different embodiments.

DETAILED DESCRIPTION

Advantages and features of embodiments may be understood more readily by reference to the following detailed description of preferred embodiments and the accompanying drawings. Embodiments may, however, be embodied in many different forms and should not be construed as being limited to those set forth herein. Rather, these embodiments are provided so that this disclosure will be thorough and complete and will fully convey exemplary implementations of embodiments to those skilled in the art, so embodiments will only be defined by the appended claims. Like reference numerals refer to like elements throughout the specification.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

The present disclosure pertains to a trench capacitor and a semiconductor device such as a semiconductor memory device having such trench capacitor, which is particularly suited for DRAM applications. The semiconductor device includes a substrate comprising a trench with corrugated sidewall surface. A trench capacitor is formed in the trench. The trench capacitor comprises inner and outer electrodes with a node dielectric layer therebetween. A transistor is provided on the substrate. The transistor comprises a source region and a drain region, a channel region between the source region and the drain region, and a gate over the channel region. The source region is electrically connected to the inner electrode of the trench capacitor. The drain region of the transistor is electrically connected to a bitline. The substrate may comprise a semiconductor-on-insulator (SOI) structure or a bulk semiconductor structure.

According to some embodiments, the substrate may comprise alternating layers. For example, the alternating layers may comprise alternating silicon germanium (SiGe) epitaxial layers and silicon (Si) epitaxial layers. Recesses are formed in the SiGe epitaxial layers, thereby forming the corrugated sidewall surface.

FIG. 1 to FIG. 10 are cross-sectional diagrams showing a method for fabricating a semiconductor device with a trench capacitor according to one embodiment of the present disclosure. As shown in FIG. 1, a substrate 10 is provided. According to one embodiment, the substrate 10 may comprise a silicon-on-insulator (SOI) structure comprising, for example, a semiconductor substrate 100, a buried oxide layer 102, and a silicon device layer 104. The buried oxide layer 102 may be optional and may be omitted in some embodiments. In some embodiments, the semiconductor substrate 100 may comprise a doped silicon substrate or other semiconductor materials.

According to one embodiment, for example, the aforesaid SOI structure may be a SIMOX (Separation by IMplanted OXygen) wafer or a bonded wafer, but is not limited thereto. According to one embodiment, for example, the semiconductor substrate 100 may be an N-type heavily doped silicon substrate, and the silicon device layer 104 may be a P-type silicon layer. According to one embodiment, for example, the silicon device layer 104 may have a thickness of about 50-500 nm, the buried oxide layer 102 may have a thickness of about 100-500 nm, and the semiconductor substrate 100 may be 50-500 micrometers, but not limited thereto.

According to one embodiment, for example, a film stack 101 of alternating layers may be disposed between the buried oxide layer 102 and the semiconductor substrate 100. According to one embodiment, for example, the aforesaid alternating layers may comprise, for example, alternating silicon germanium (SiGe) epitaxial layers 101*a* and silicon (Si) epitaxial layers 101*b*. According to one embodiment, for example, the aforesaid alternating layers may be formed by a repeated alternation of epitaxial growth on the semiconductor substrate 100.

According to one embodiment, for example, each of the SiGe epitaxial layers 101*a* may have a thickness of about 2-20 nm and each of the Si epitaxial layers 101*b* may have a thickness of about 2-20 nm. It is to be understood that there may be multiple pairs of SiGe layer epitaxial 101*a* and Si epitaxial layer 101*b*, for example, hundreds of SiGe layer/Si layer pairs. For the sake of simplicity, only two pairs of alternating SiGe epitaxial layer 101*a* and Si epitaxial layer 101*b* are illustrated.

Figure 2:
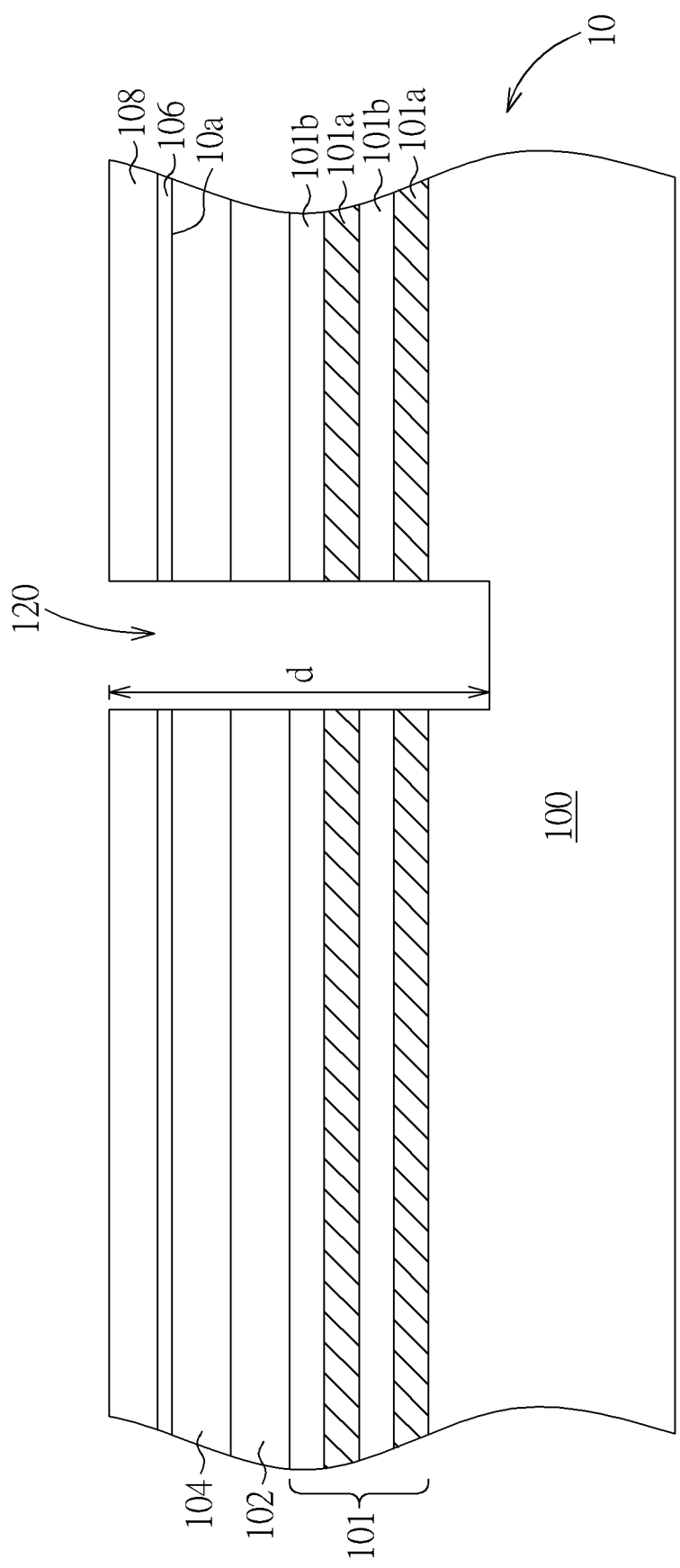

As shown in FIG. 2, an optional pad oxide layer 106 may be formed on a top surface 10*a* of the substrate 10. For example, the pad oxide layer 106 may be formed by chemical vapor deposition (CVD) methods or thermal methods known in the art. For example, the pad oxide layer 106 may be a silicon oxide layer and may have a thickness of about 10-50 nm. After depositing the pad oxide layer 106, a nitride layer 108 is deposited on the pad oxide layer 106. For example, the nitride layer 108 may be a silicon nitride layer and may have a thickness of about 100-300 nm. The nitride layer 108 may be deposited by CVD methods.

A lithographic process and an anisotropic dry etching process such as a reactive ion etching (ME) process may be performed to form a trench 120 extending through the nitride layer 108, the pad oxide layer 106, the silicon device layer 104, the buried oxide layer 102, the film stack 101, and into the semiconductor substrate 100. According to one embodiment, for example, the trench 120 may have a depth d ranging approximately between 200 and 1000 nm, but is not limited thereto. It is to be understood that when viewed from the above, the shape of the trench 120 may comprise a circular shape, an oval shape, or a rectangular shape, but not limited thereto. It is to be understood that a plurality of trenches arranged in an array may be formed in the substrate 10 although only one trench 120 is illustrated in the figures.

Figure 3:
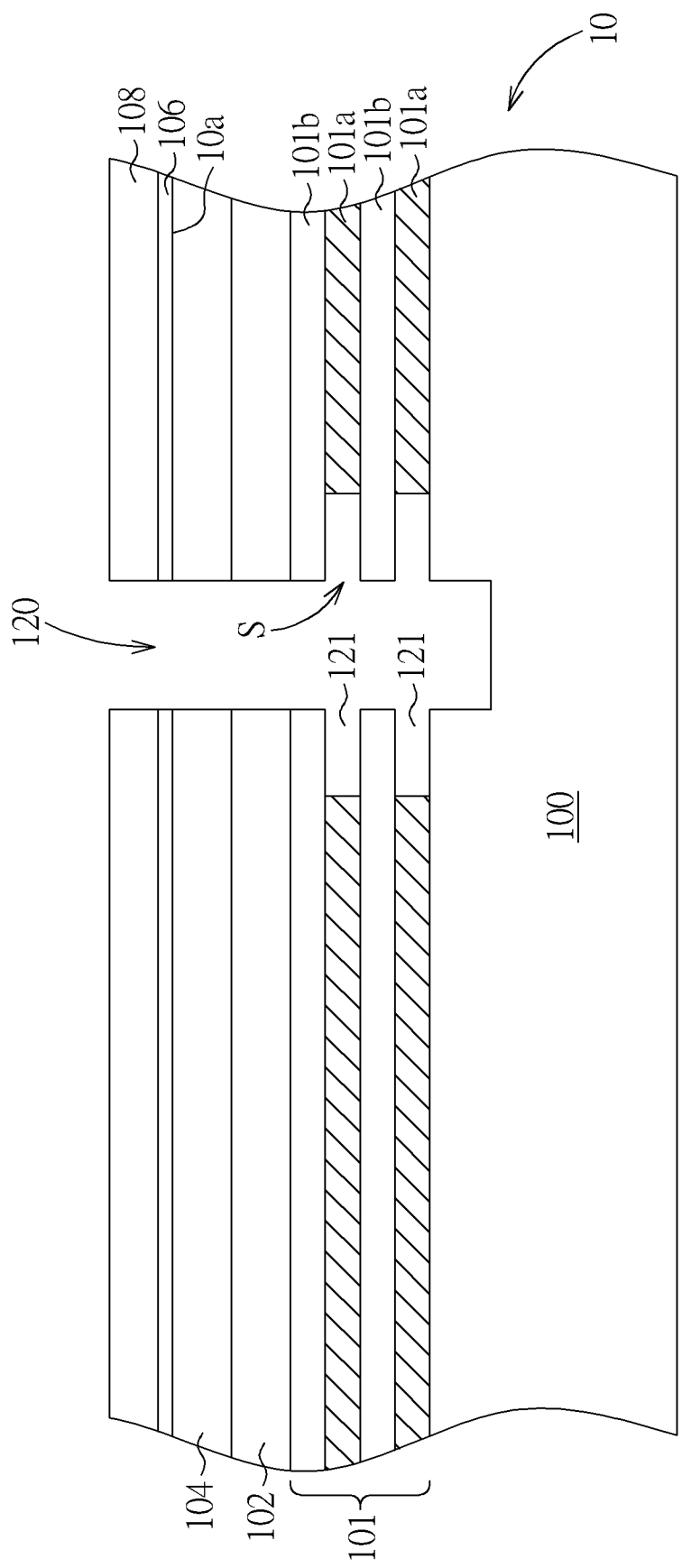

As shown in FIG. 3, an isotropic etching process such as a wet etching process is performed to selectively etch the SiGe epitaxial layer 101*a* of the film stack 101 within the trench 120. According to one embodiment, for example, the chemistry employed in the aforesaid wet etching process may comprise an etchant solution comprising HF, $H_2O_2$, and $CH_3COOH$, an etchant solution comprising KOH, an etchant solution comprising KOH and $H_2O_2$, an etchant solution comprising $NH_4OH$, an etchant solution comprising $NH_4OH$ and $H_2O_2$, an etchant solution comprising tetramethylammonium hydroxide (TMAH), or any combinations thereof. The selective etching pulls back the SiGe epitaxial layer 101*a* of the film stack 101 within the trench 120, while the silicon epitaxial layers 101*b* remain substantially intact, thereby forming recesses 121 and corrugated sidewall surface S on the sidewall of the trench 120. The span of the corrugated sidewall surface S is substantially commensurate with the entire thickness of the film stack 101 within the trench 120.

Figure 4:
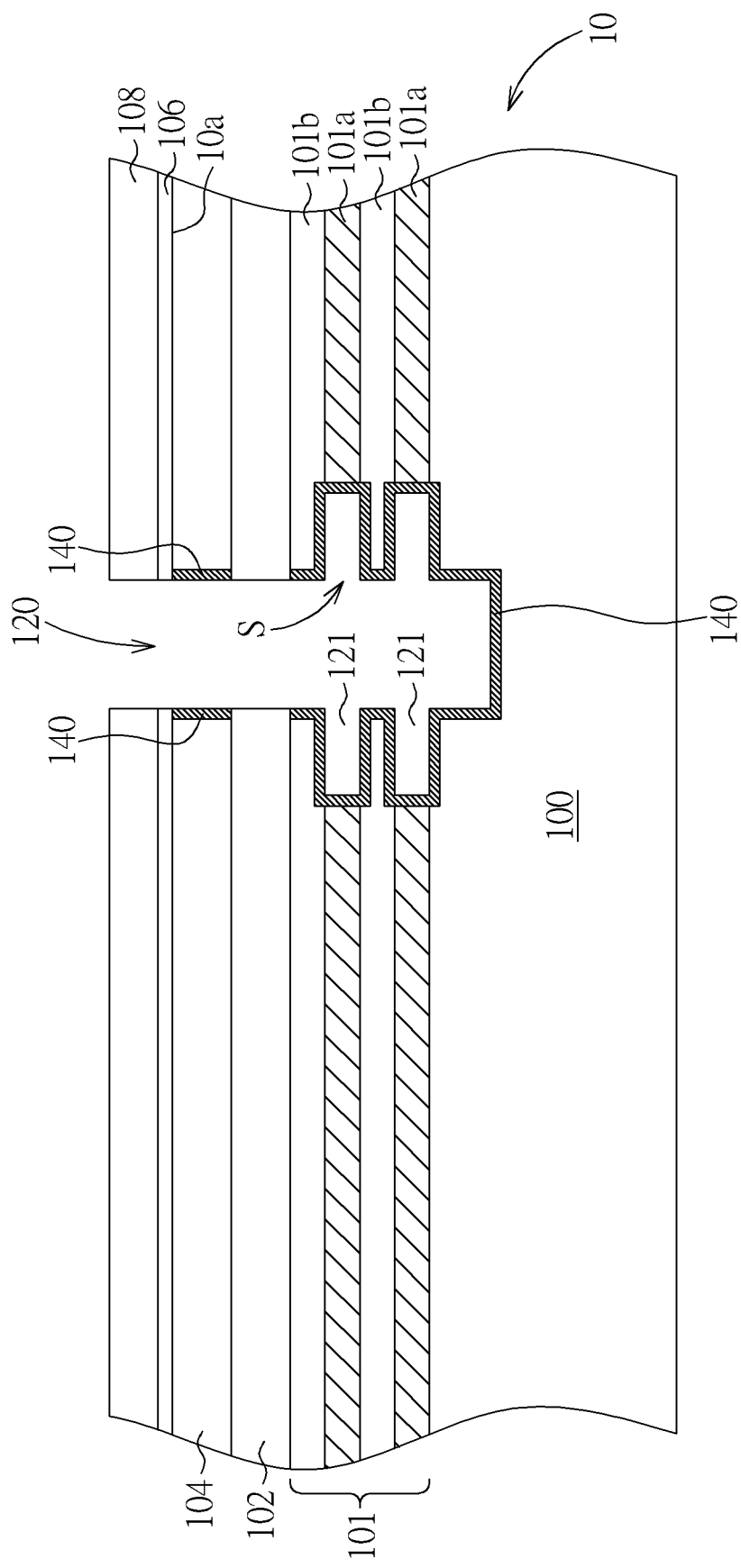

As shown in FIG. 4, optionally, a self-aligned silicide (salicide) process is performed to transform the exposed Si-containing sidewall portions of the silicon device layer 104, the recessed SiGe epitaxial layer 101*a*, the Si epitaxial layers 101*b*, and the exposed surface of the semiconductor substrate 100 into a silicide layer 140. According to one embodiment, for example, the silicide layer 140 may comprise tungsten silicide ($WSi_x$), cobalt silicide ($CoSi_x$), nickel silicide ($NiSi_x$), or titanium silicide ($TiSi_x$), but not limited thereto. According to one embodiment, for example, to form the silicide layer 140, a thin metal layer (not shown) such as W, Co, Ni, or Ti is deposited on the substrate 10. The thin metal layer conformally covers the interior surface of the trench 120 including the recesses 121. Subsequently, an thermal or anneal process such as a rapid thermal annealing (RTA) is performed such that the metal reacts with the exposed sidewall of the silicon device layer 104, the recessed SiGe epitaxial layer 101*a*, the Si epitaxial layers 101*b*, and the exposed surface of the semiconductor substrate 100, thereby forming the silicide layer 140 within the trench 120. The unreacted metal layer may be removed using methods known in the art.

Figure 5:
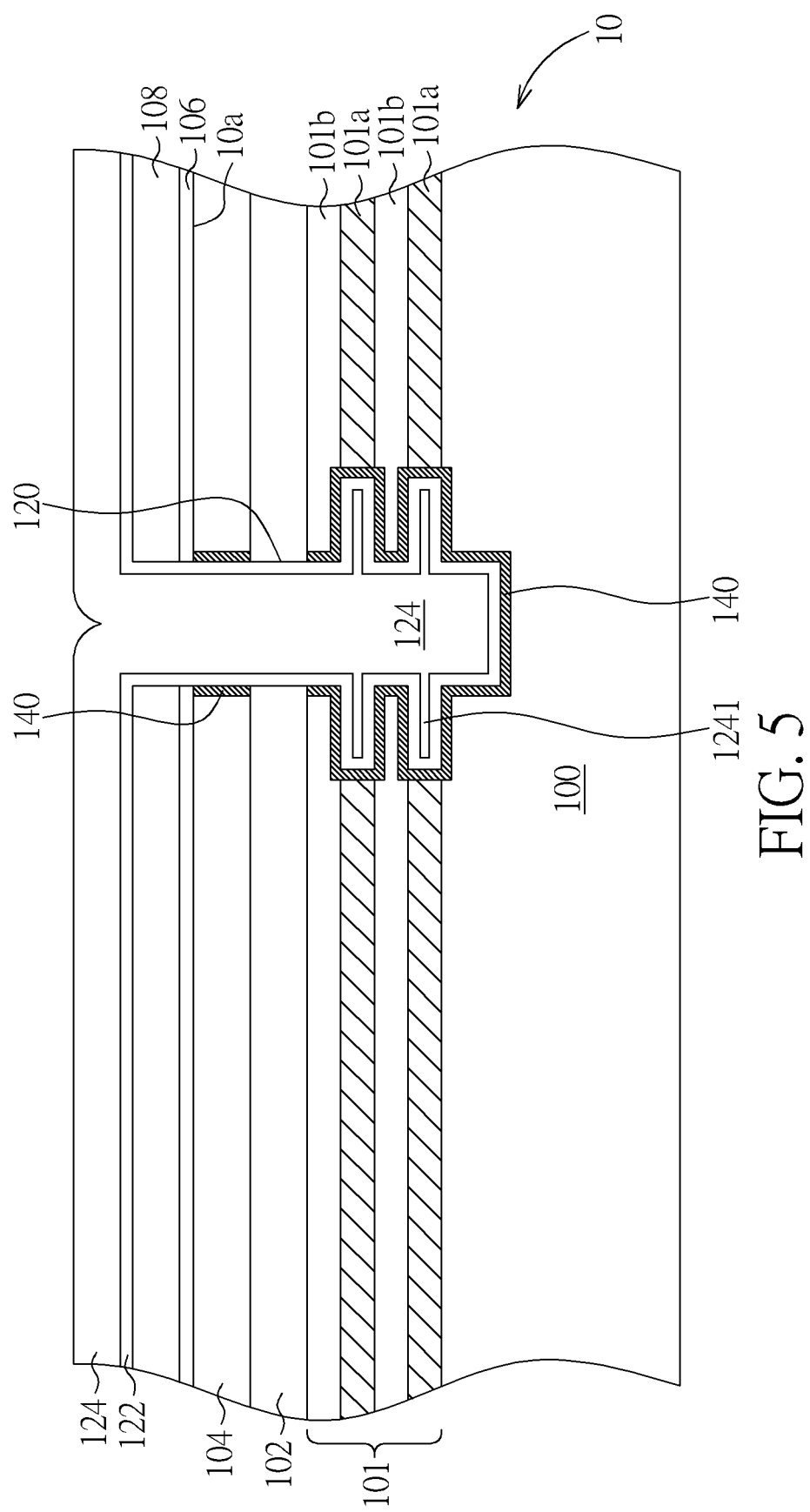

As shown in FIG. 5, a node dielectric layer 122 is conformally deposited on the interior surface of the trench 120 and on the top surface of the nitride layer 108. The node dielectric layer 122 may comprise, for example, silicon oxide, silicon nitride, aluminum oxide, hafnium oxide, zirconium oxide, barium strontium oxide, or any combinations thereof. Preferably, the node dielectric layer 122 may comprise a high-k (i.e., k>4.0) dielectric material, such as $HfO_2$ or $HfSiO_x$. The node dielectric layer 122 may be deposited by any suitable deposition methods such as CVD or atomic layer deposition (ALD) methods. According to one embodiment, the node dielectric layer 122 may have a thickness of about 10-100 angstroms, but not limited thereto. The node dielectric layer 122 conformally covers the interior surfaces of the recesses 121 and does not completely fill up the recesses 121.

Subsequently, a capacitor electrode layer (inner electrode) 124 is deposited into the trench 120. According to one embodiment, for example, the capacitor electrode layer 124 may comprise doped polysilicon, Ti, TiN, W, or the like. According to one embodiment, for example, the capacitor electrode layer 124 may comprise a titanium nitride (TiN) layer lining the sidewall of the trench 120 on the node dielectric layer 122, and a doped polysilicon layer that completely fills up the remaining space within the trench 120. In some embodiments, the TiN layer may be omitted. According to one embodiment, the doped polysilicon layer may be an N-type doped polysilicon. According to one embodiment, the capacitor electrode layer 124 comprises fin-like electrodes 1241 laterally extending into the recesses 121, respectively.

Figure 6:
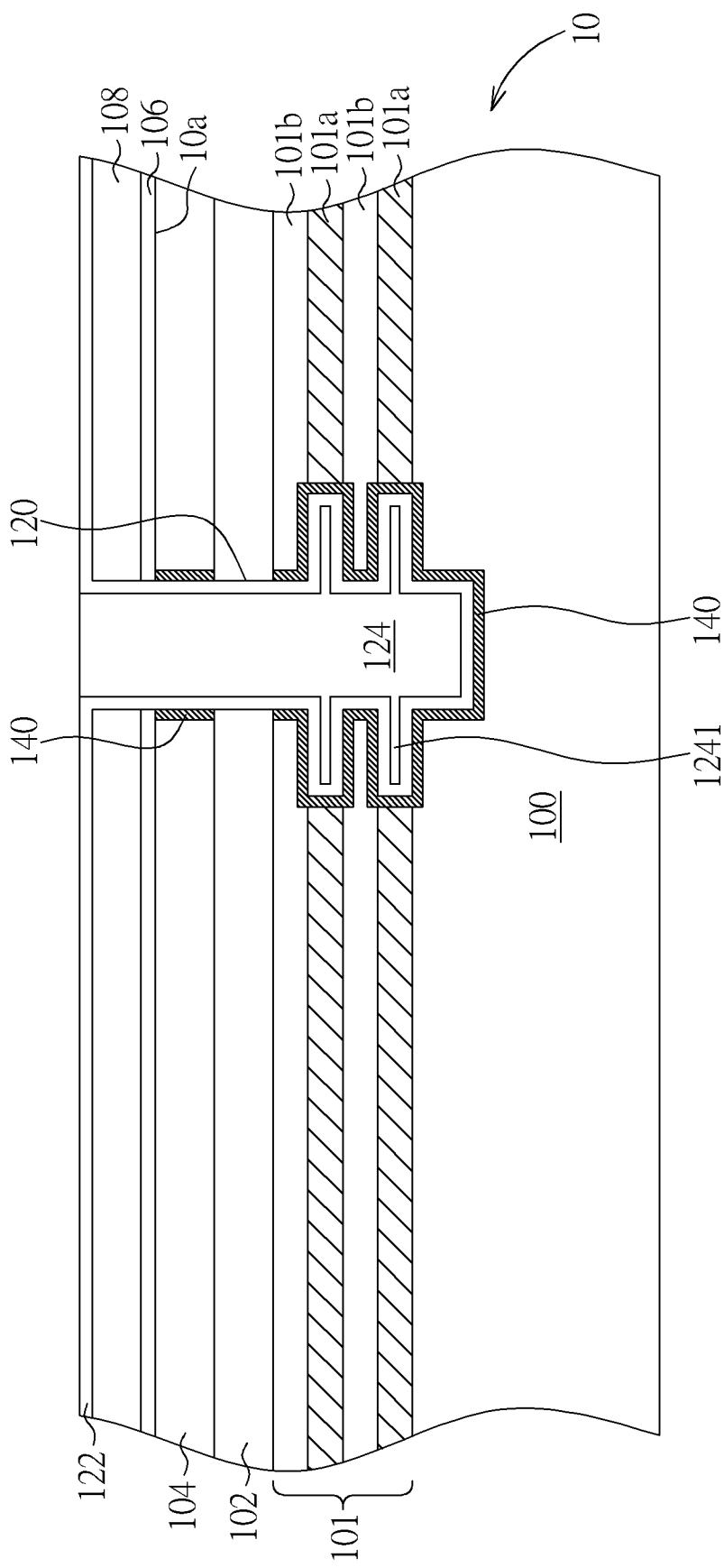

As shown in FIG. 6, after the deposition of the capacitor electrode layer 124, a planarization process may be performed to render the upper surface of the capacitor electrode layer 124 within the trench 120 coplanar with the upper surface of the node dielectric layer 122. According to one embodiment, for example, the planarization process may be a chemical mechanical polishing (CMP) process that is a material removal process using both chemical reactions and mechanical forces to remove material and planarize a surface. At this point, the capacitor electrode layer 124 outside the trench 120 is removed. In some embodiments, the capacitor electrode layer 124 outside the trench 120 may be removed by using a dry etching process.

Figure 7:
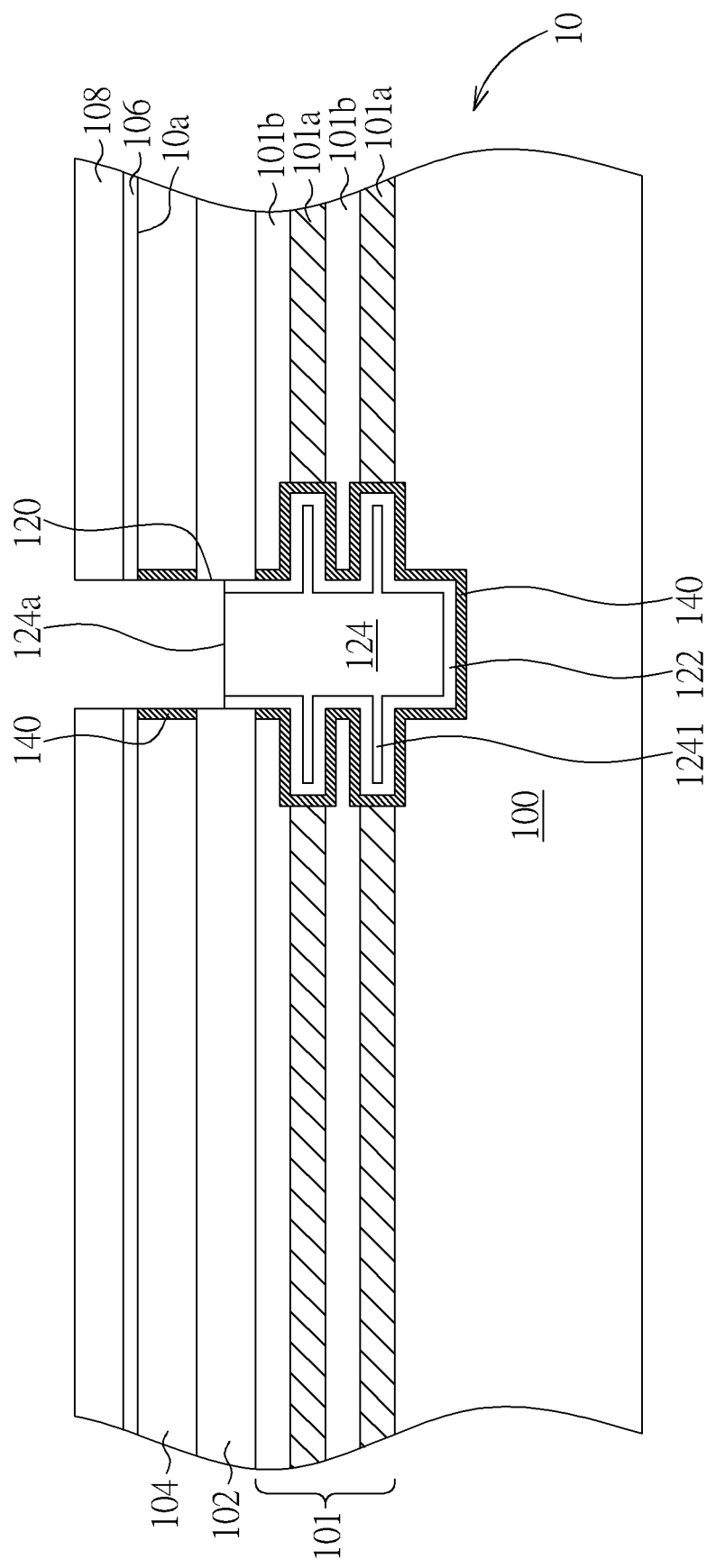

As shown in FIG. 7, subsequently, an etch-back process is performed. An upper portion of the capacitor electrode layer 124 within the trench 120 is selectively removed to expose an upper portion of the node dielectric layer 122. For example, the top surface 124a of the capacitor electrode layer 124 may be recessed to a horizontal plane that is somewhere between an upper surface and lower surface of the buried oxide layer 102. Subsequently, the exposed upper portion of the node dielectric layer 122 is then selectively removed. The selective etching methods of the capacitor electrode layer 124 and the node dielectric layer 122 are known in the art, and therefore the details of the etchant chemistry is omitted. For example, the capacitor electrode layer 124 may be etched back using an isotropic etching method, and the upper portion of the node dielectric layer 122 may be removed by using a chemical dry etch (CDE) process.

Figure 8:
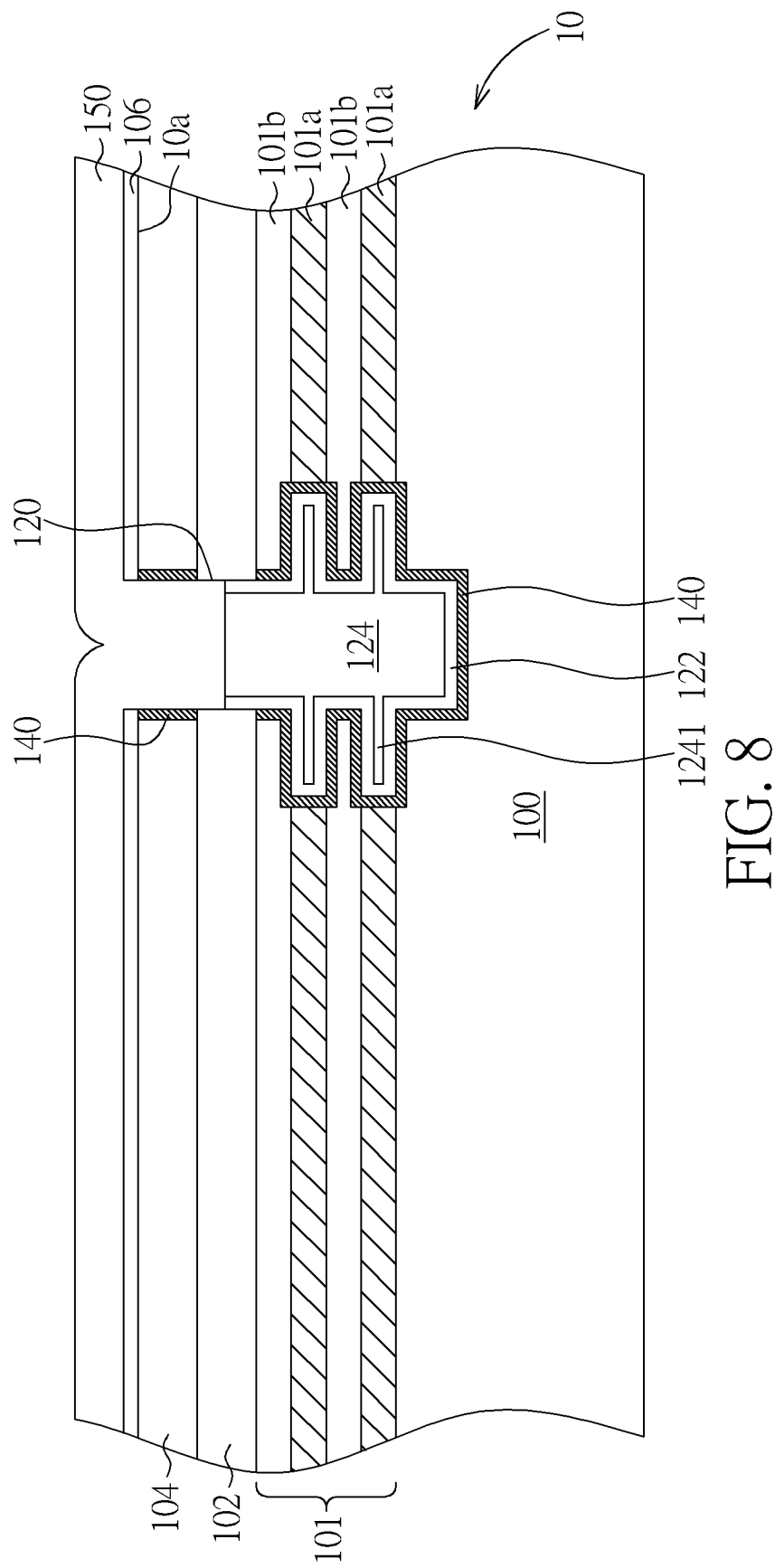

As shown in FIG. 8, a wet etching process may be performed to remove the nitride layer 108. A conductive layer 150 is then deposited on the substrate 10 in a blanket manner. The conductive layer 150 covers the pad oxide layer 106 and fills up the trench 120. According to one embodiment, for example, the conductive layer 150 may comprise W, Ti, TiN, Ta, TaN, Cu, Au, Ni, N-type doped polysilicon, or any combinations thereof. According to one embodiment, for example, the remaining space of the trench 120 is completely filled with the conductive layer 150. According to one embodiment, the conductive layer 150 is in direct contact with the silicide layer 140 formed on the sidewall of the silicon device layer 104. According to one embodiment, the conductive layer 150 is in direct contact with the capacitor electrode layer 124 the within the trench 120.

Figure 9:
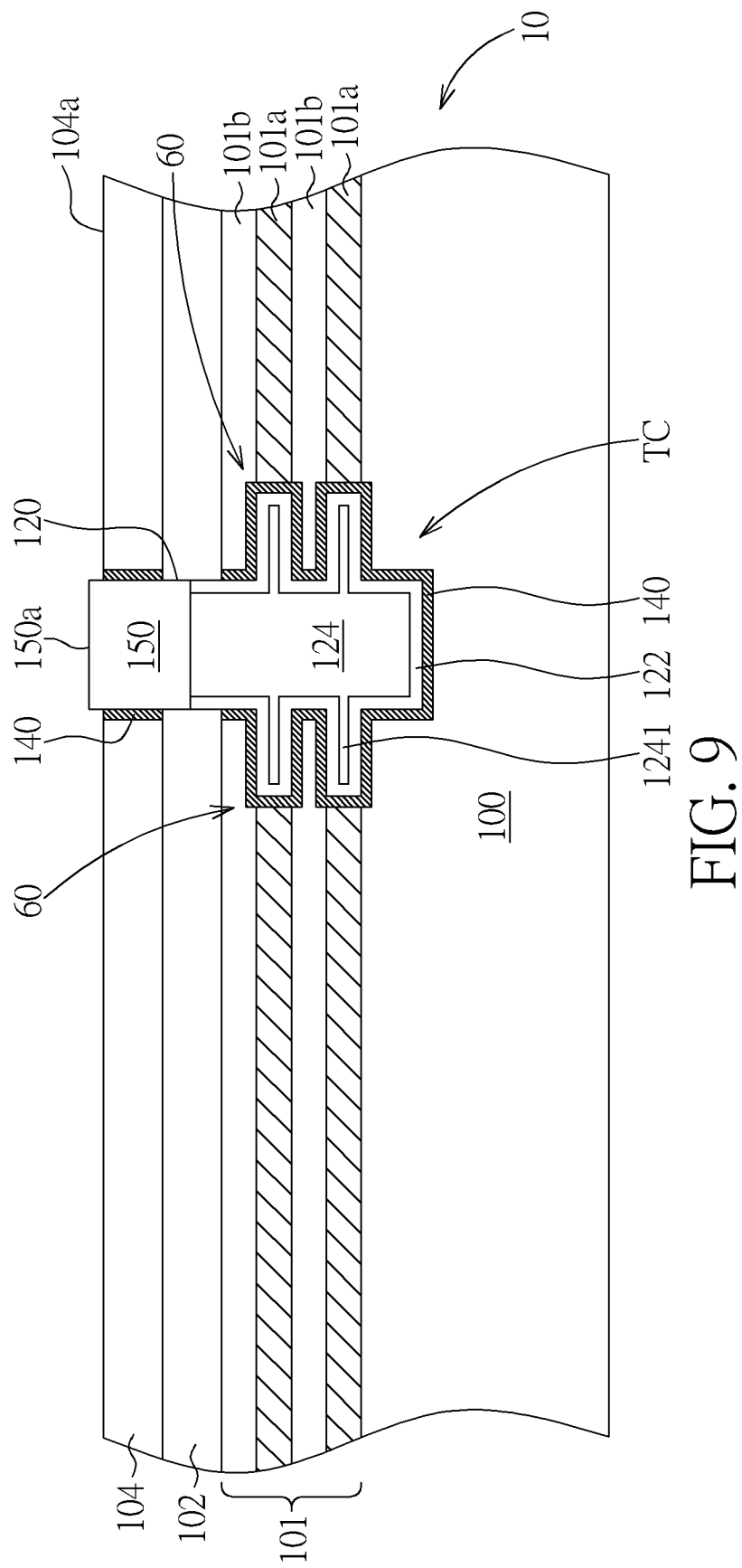

As shown in FIG. 9, after the deposition of the conductive layer 150, a planarization process may be performed to render the upper surface 150a of the conductive layer 150 within the trench 120 coplanar with the upper surface of the pad oxide layer 106. According to one embodiment, for example, the planarization process may be a CMP process or an etch-back process. After removing the conductive layer 150 outside the trench 120, the pad oxide layer 106 is revealed. Subsequently, an isotropic etching process may be performed to remove the pad oxide layer 106. After removing the pad oxide layer 106, the upper surface 104a of the silicon device layer 104 is revealed. According to one embodiment, for example, the upper surface 150a of the conductive layer 150 may be slightly higher than the upper surface 104a of the silicon device layer 104.

At this point, a trench capacitor TC is formed. The trench capacitor TC comprises the capacitor electrode layer (inner electrode) 124 inside the trench 120, the node dielectric layer 122, and an outer electrode comprised of the N-type doped film stack 101 and the N-type doped semiconductor substrate 100. The node dielectric layer 122 surrounds the capacitor electrode layer 124. According to one embodiment, the silicide layer 140 under the buried oxide layer 102, the film stack 101 around the silicide layer 140, and the semiconductor substrate 100 around the lower sidewall and the bottom of the trench 120 function as the outer electrode of the trench capacitor TC.

The conductive layer 150 buried in the trench 120 is situated atop the capacitor electrode layer 124 and may function as a buried strap that electrically connects the capacitor electrode layer 124 with the silicon device layer 104. The silicide layer 140 between the conductive layer 150 and the silicon device layer 104 creates an ohmic contact, thereby reducing the contact resistance. The trench capacitor TC comprises a corrugated structure 60 that is comprised of the fin-like electrodes 1241 embedded in the film stack 101, which increases the capacitor surface area without the need of increasing the trench depth as the geometry gets smaller and smaller. The shallower trench also reduces the serial resistance and improves the device performance.

Figure 10:
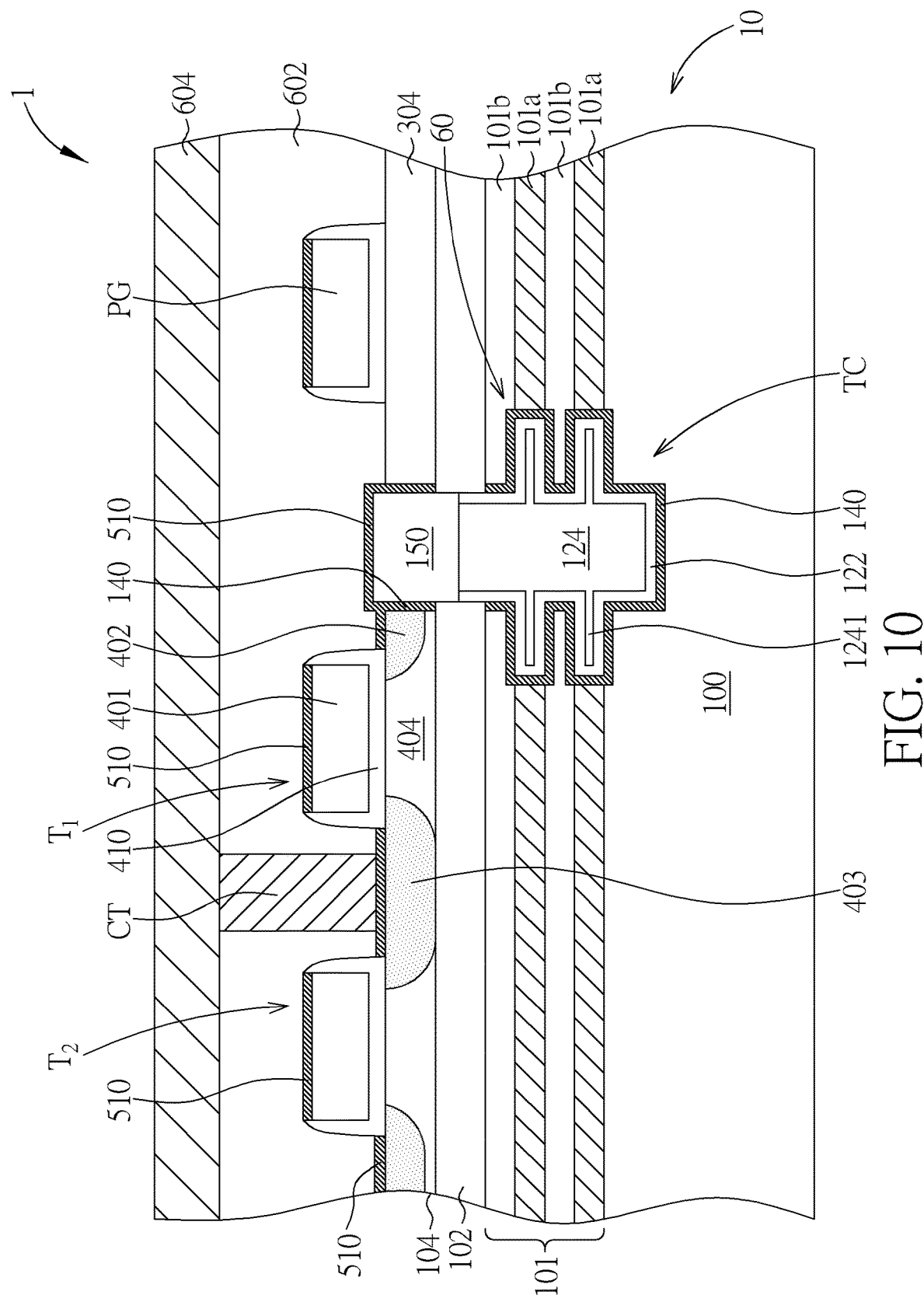

As shown in FIG. 10, subsequently, several fabrication processes for making semiconductor circuit elements on the silicon device layer 104 are performed to complete the formation of the semiconductor device 1. For example, a shallow trench isolation (STI) process is carried out to form STI region 304 in the silicon device layer 104 so as to define active areas of the silicon device layer 104, on which the semiconductor circuit elements such as metal-oxide-semiconductor (MOS) transistors $T_1$, $T_2$ are fabricated. The two exemplary MOS transistors $T_1$, $T_2$ may function as select transistors. Each of the two exemplary MOS transistors $T_1$, $T_2$ comprises a gate 401, an N-type source region 402, an N-type drain region 403, a gate oxide layer 410 under the gate 401. For example, the two exemplary mirror-symmetric MOS transistors $T_1$, $T_2$ share the N-type drain region 403. Silicide layers 510 may be formed on the gate 401, the N-type source region 402, the N-type drain region 403, and the conductive layer 150. The N-type source region 402 is electrically connected to the conductive layer 150 through the silicide layer 140. The silicide layer 510 on the conductive layer 150 may be in direct contact with the silicide layer 140 on the sidewall of the silicon device layer 104.

It is understood that the two exemplary MOS transistors $T_1$, $T_2$ may be planar-type transistor or fin-type transistors. It is understood that in some embodiments the two exemplary MOS transistors $T_1$, $T_2$ may be fabricated before the trench capacitor TC is formed. According to one embodiment, for example, the junction depth of the N-type source region 402 may be shallower than the total thickness of the silicon device layer 104 so that the P-body region of the MOS transistor $T_2$ is connected to source for body factor reduction. The N-type drain region 403 needs to be deep enough to separate the two P-body regions of the two exemplary MOS transistors $T_1$, $T_2$. In some embodiments, the N-type source region 402 and the N-type drain region 403 may have the same depth that is greater than or equal to the total thickness of the silicon device layer 104.

According to one embodiment, during operation, the trench capacitor TC is not charged to a voltage that is greater than 0.6V in order not to turn on the parasitic diode from P-body regions to N-type drain region 403. Further, a passing gate PG may be formed on the STI region 304. An inter-layer dielectric (ILD) layer 602 may be deposited in a blanket manner to cover the two exemplary MOS transistors $T_1$, $T_2$ and the passing gate PG. A contact plug CT may be formed in the ILD layer 602. The contact plug CT is electrically connected to the N-type drain region 403. For example, the contact plug CT may be a tungsten plug, but is not limited thereto. A bit line 604 is formed on the ILD layer 602 and is electrically connected to the contact plug CT. The bit line 604 may be a metal line that is formed by metal interconnection processes. For example, the bit line 604 may be a damascened copper metal line.

Structurally speaking, as shown in FIG. 10, the semiconductor device 1 such as a DRAM cell is fabricated on the substrate 10 comprising a semiconductor substrate 100, a buried oxide layer 102 on the semiconductor substrate 100, and a silicon device layer 104 on the buried oxide layer 102. A film stack 101 comprised of alternating layers is disposed between the buried oxide layer 102 and the semiconductor substrate 100. The aforesaid alternating layers comprise, for example, alternating silicon germanium (SiGe) epitaxial layers 101a and silicon (Si) epitaxial layers 101b. A trench capacitor TC is disposed in a trench 120 of the substrate 10.

The trench capacitor TC penetrates through the silicon device layer 104, the buried oxide layer 102, and the film stack 101, and extends into the semiconductor substrate 100. The semiconductor device 1 further comprises the corrugated structure 60 that is embedded in the film stack 101. The corrugated structure 60 increases the capacitor surface area without the need of increasing the trench depth as the geometry gets smaller and smaller. The shallower trench also reduces the serial resistance and improves the device performance.

The semiconductor device 1 further comprises the transistor $T_1$ on the silicon device layer 104. The transistor $T_1$ comprises the source doping region 402 and the drain doping region 403 in the silicon device layer 104, a channel region 404 between the source doping region 402 and the drain doping region 403, and a gate 401 over the channel region 404. The source doping region 403 is electrically connected to the inner electrode 124 of the trench capacitor TC.

Figure 11:
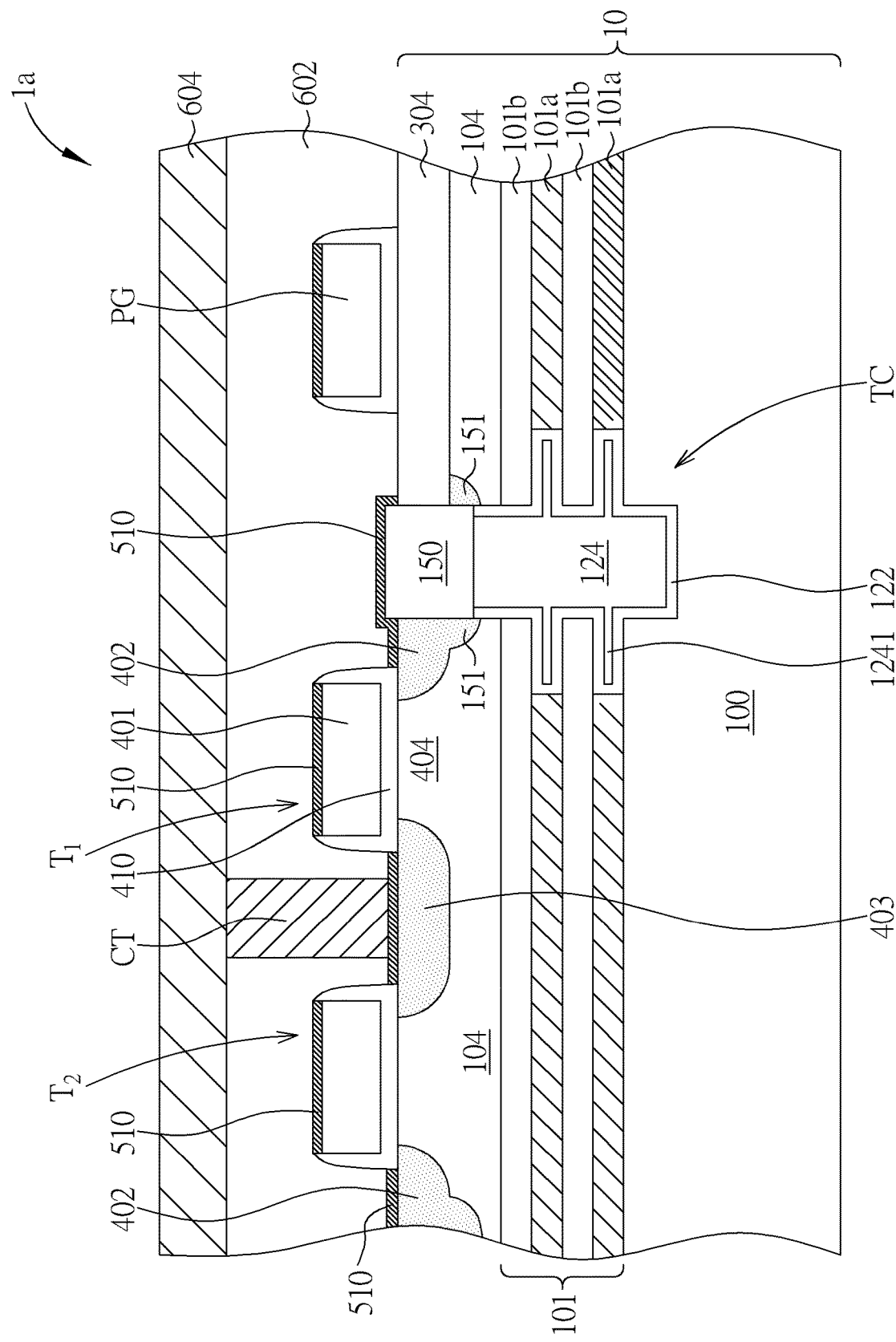
FIG. 11 is a cross-sectional diagram showing a semiconductor device with a trench capacitor according to another embodiment of the present disclosure.

FIG. 11 is a cross-sectional diagram showing a semiconductor device 1a with a trench capacitor TC according to another embodiment of the present disclosure, wherein like numeral numbers designate like regions, layers or elements. As shown in FIG. 11, the major difference between the semiconductor device 1a in FIG. 11 and the semiconductor device 1 in FIG. 10 is that the semiconductor device 1a in FIG. 11 does not include a buried oxide layer between the silicon device layer 104 and the film stack 101 in the structure of the substrate 10. In other words, as shown in FIG. 11, the silicon device layer 104 is in direct contact with the film stack 101 in the structure of the substrate 10. Further, the trench capacitor TC does not include a silicide layer between the node dielectric layer 122 and the film stack 101 and between the node dielectric layer 122 and the semiconductor substrate 100. In other words, as shown in FIG. 11, the node dielectric layer 122 is in direct with the film stack 101 and the semiconductor substrate 100.

Likewise, as shown in FIG. 11, the conductive layer 150 may function as a buried strap that electrically connects the N-type source region 402 of the MOS transistors $T_1$ with the capacitor electrode layer 124 of the trench capacitor TC. According to one embodiment, for example, the capacitor electrode layer 124 may comprise doped polysilicon, Ti, TiN, W, or the like. According to one embodiment, for example, the capacitor electrode layer 124 may comprise a TiN layer (not explicitly shown) lining the sidewall of the trench 120 on the node dielectric layer 122, and a doped polysilicon layer (not explicitly shown) that completely fills up the remaining space within the trench 120. In some embodiments, the TiN layer may be omitted. According to one embodiment, the doped polysilicon layer may be an N-type doped polysilicon. According to one embodiment, the capacitor electrode layer 124 further comprises fin-like electrodes 1241 laterally extending into the recesses 121.

It is understood that the two exemplary MOS transistors $T_1$, $T_2$ may be planar-type transistor or fin-type transistors. It is understood that in some embodiments the two exemplary MOS transistors $T_1$, $T_2$ may be fabricated before the trench capacitor TC is formed. According to one embodiment, for example, the junction depth of the N-type source region 402 and the N-type drain region 403 may be shallower than the total thickness of the silicon device layer 104. An annular N-type out-diffusion region 151 may be formed in the silicon device layer 104. The annular N-type out-diffusion region 151 is in direct contact with the conductive layer 150 and may be merged with the N-type source region 402.

In general, the semiconductor device 1a is fabricated on the substrate 10 comprising the semiconductor substrate 100, the silicon device layer 104, and the film stack 101. The film stack 101 is comprised of alternating layers 101a, 101b and is disposed between the silicon device layer 104 and the semiconductor substrate 100. The trench capacitor TC is disposed in the trench 120 of the substrate 10. The trench capacitor TC penetrates through the silicon device layer 104 and the film stack 101, and extends into the semiconductor substrate 100. The trench capacitor TC comprises the corrugated structure 60 embedded in the film stack 101. The MOS transistor $T_1$ is disposed on the silicon device layer 104. The MOS transistor $T_1$ comprises the N-type source region 402 and the N-type drain region 403 in the silicon device layer 104, the channel region 404 between the N-type source region 402 and the N-type drain region 403, and the gate 401 over the channel region 404. The N-type source region 402 is electrically connected to the capacitor electrode layer 124 of the trench capacitor TC.

According to one embodiment, the alternating layers comprise alternating SiGe epitaxial layers 101a and Si epitaxial layers 101b. According to one embodiment, each of the SiGe epitaxial layers 101a has a thickness of about 2-20 nm and each of the Si epitaxial layers 101b has a thickness of about 2-20 nm. According to one embodiment, the trench comprises recesses 121 in the SiGe epitaxial layers 101a. According to one embodiment, the capacitor electrode layer 124 comprises fin-like electrodes 1241 laterally extending into in the recesses 121. According to one embodiment, the trench 120 has a depth ranging between 200 and 1000 nm.

According to one embodiment, the trench capacitor TC comprises a node dielectric layer 122 lining an interior surface of the trench 120. According to one embodiment, the capacitor electrode layer 124 is surrounded by the node dielectric layer 122.

According to one embodiment, the semiconductor substrate 100 is an N-type heavily doped silicon substrate, and the silicon device layer 104 is a P-type silicon layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
   a bulk semiconductor substrate;
   a film stack on the bulk semiconductor substrate;
   a silicon device layer on the film stack;
   at least one trench with corrugated sidewall surface extending into the silicon device layer, the film stack, and the bulk semiconductor substrate;
   at least one trench capacitor located in the at least one trench, the at least one trench capacitor comprising an inner electrode and an outer electrode with a node dielectric layer therebetween, wherein the node dielectric layer is in direct with the film stack and the bulk semiconductor substrate;
   at least one transistor on the substrate, wherein the at least one transistor comprises a source region and a drain region, a channel region between the source region and the drain region, and a gate over the channel region;
   a conductive layer buried in the at least one trench to electrically connect the source region with the inner electrode, wherein the conductive layer is in direct contact with a sidewall of the source region;

a trench isolation layer disposed around the conductive layer; and a silicide layer continuously capping the source region and the conductive layer and extending to the trench isolation layer, wherein the silicide layer covers an entire top surface of the conductive layer and is in direct contact with the conductive layer and the trench isolation layer.

2. The semiconductor memory device according to claim 1, wherein the film stack comprises alternating layers.

3. The semiconductor memory device according to claim 2, wherein the alternating layers comprise alternating silicon germanium (SiGe) epitaxial layers and silicon (Si) epitaxial layers.

4. The semiconductor memory device according to claim 3, wherein each of the SiGe epitaxial layers has a thickness of about 2-20 nm and each of the Si epitaxial layers has a thickness of about 2-20 nm.

5. The semiconductor device memory according to claim 3, wherein the at least one trench comprises recesses in the SiGe epitaxial layers, respectively.

6. The semiconductor device according to claim 5, wherein the inner electrode layer comprises fin-like electrodes laterally extending into the recesses, respectively.

7. The semiconductor device according to claim 1, wherein the at least one trench has a depth ranging between 200 and 1000 nm.

8. The semiconductor device according to claim 1, wherein the conductive layer comprises W, Ti, TiN, Ta, TaN, Cu, Au, Ni, N-type doped polysilicon, or any combinations thereof.

9. The semiconductor device according to claim 1 further comprising:

an annular out-diffusion region disposed in the silicon device layer and surrounding a lower portion of the conductive layer.

10. The semiconductor device according to claim 9, wherein the annular out-diffusion region is in direct contact with the conductive layer and is merged with the source region.

* * * * *